United States Patent
Yang

(10) Patent No.: US 12,261,189 B2
(45) Date of Patent: Mar. 25, 2025

(54) IMAGE SENSING DEVICE

(71) Applicant: SK hynix Inc., Icheon-si (KR)

(72) Inventor: Yun Hui Yang, Icheon-si (KR)

(73) Assignee: SK HYNIX INC., Icheon-si (KR)

(*) Notice: Subject to any disclaimer, the term of this patent is extended or adjusted under 35 U.S.C. 154(b) by 390 days.

(21) Appl. No.: 17/726,975

(22) Filed: Apr. 22, 2022

(65) Prior Publication Data

US 2022/0399392 A1 Dec. 15, 2022

(30) Foreign Application Priority Data

Jun. 9, 2021 (KR) .................. 10-2021-0074559

(51) Int. Cl.
*H01L 27/146* (2006.01)

(52) U.S. Cl.
CPC .. *H01L 27/14643* (2013.01); *H01L 27/14607* (2013.01); *H01L 27/14627* (2013.01); *H01L 27/1463* (2013.01)

(58) Field of Classification Search
CPC ......... H01L 27/14643; H01L 27/14607; H01L 27/14627; H01L 27/1463; H01L 27/14625; H01L 27/14603; H01L 27/14621; H01L 27/14629

See application file for complete search history.

(56) References Cited

U.S. PATENT DOCUMENTS

| | | | |
|---|---|---|---|
| 9,728,570 B2 | 8/2017 | Chiang et al. | |
| 10,032,819 B2 | 7/2018 | Lee et al. | |
| 11,676,979 B2* | 6/2023 | Lee | H01L 27/14685 257/432 |
| 2021/0104560 A1 | 4/2021 | Lee | |
| 2021/0399037 A1 | 12/2021 | Lee | |
| 2023/0215890 A1* | 7/2023 | Mun | H01L 27/14685 257/292 |

FOREIGN PATENT DOCUMENTS

| | | |
|---|---|---|
| CN | 101807591 A | 8/2010 |
| CN | 109328314 A | 2/2019 |
| CN | 112599544 A | 4/2021 |

* cited by examiner

*Primary Examiner* — Douglas W Owens
(74) *Attorney, Agent, or Firm* — Perkins Coie LLP

(57) ABSTRACT

An image sensing device is provided to include: a substrate including photoelectric conversion elements, each configured to generate photocharge corresponding to the intensity of incident light; a plurality of optical filters disposed over the substrate and configured to selectively transmit the incident light to the plurality of photoelectric conversion elements; and an optical grid structure disposed between the optical filters adjacent to each other. The optical grid structure comprises a capping layer disposed along a boundary of the optical grid structure and structured to define a space with an open area to expose the space to an outside of the optical grid structure so that the space is filled with air as an air layer, wherein a first width of a top side of the air layer is smaller than a second width of a bottom side thereof.

20 Claims, 13 Drawing Sheets

IMAGE SENSING DEVICE

CROSS-REFERENCES TO RELATED APPLICATION

This patent document claims priority and benefits of Korean patent application number 10-2021-0074559, filed on Jun. 9, 2021, the disclosure of which is incorporated herein by reference in its entirety as part of the disclosure of this patent document.

TECHNICAL FIELD

Various embodiments generally relate to an image sensing device including optical filters disposed adjacent to each other.

BACKGROUND

An image sensing device refers to a device for capturing an optical image by using the property of a photo-sensitive semiconductor material that reacts to light. The development of automobile industry, medical industry and computer and communication industry has increased the demand for high-performance image sensing devices in a variety of fields such as a smart phone, digital camera, game machine, IOT (Internet of Things), robot, security camera and medical micro camera.

The image sensing devices may be roughly divided into a CCD (Charge Coupled Device) image sensing device and a CMOS (Complementary Metal Oxide Semiconductor) image sensing device. The CCD image sensing device provides a higher image quality than the CMOS image sensing device, but has a larger size and consumes a larger amount of power than the CMOS image sensing device. The CMOS image sensing device may be implemented to have a smaller size and to consume a smaller power than the CCD image sensing device. Furthermore, since the CMOS image sensing device is fabricated by the CMOS fabrication technology, a light sensing element and a signal processing circuit may be integrated into a single chip, which makes it possible to fabricate a small-sized image sensing device at a low cost. For these reasons, the CMOS image sensing device is developed for many applications including a mobile device.

SUMMARY

Various embodiments are directed to an image sensing device including an air grid structure, which is capable of maintaining the stability of an air grid structure even though the pressure of air rises in an image sensor.

In one aspect, an image sensing device is provided to include: a substrate including a plurality of photoelectric conversion elements each configured to generate photocharge corresponding to the intensity of incident light; a plurality of optical filters disposed over the substrate and configured to selectively transmit the incident light to the plurality of photoelectric conversion elements; and an optical grid structure disposed between the optical filters adjacent to each other. The optical grid structure is configured to reduce optical crosstalk between adjacent photoelectric conversion elements. In some implementations, the optical grid structure includes: an air layer disposed between the optical filters; and a capping layer configured to surround the air layer, and having an open area formed over the air layer, such that at least a part thereof is open to the outside of the optical grid structure, and a first width of the top side of the air layer may be smaller than a second width of the bottom side thereof. In some implementations, the optical grid structure comprises a capping layer disposed along a boundary of the optical grid structure and structured to define a space with an open area to expose the space to an outside of the optical grid structure so that the space is filled with air as an air layer, wherein a first width of a top side of the air layer is smaller than a second width of a bottom side thereof.

In another aspect, an image sensing device is provided to include: optical filters adjacent to each other; and an optical grid structure disposed between the optical filters. The optical grid structure may include: an air layer disposed between the optical filters; and a capping layer configured to surround the air layer, and having an open area formed over the air layer, such that at least a part thereof is open to the outside of the optical grid structure, and a first width of the top side of the air layer may be smaller than a second width of the bottom side thereof.

In another aspect, an image sensing device is provided to comprise: optical filters that are disposed adjacent to each other; and an optical grid structure disposed between the optical filters to reduce optical crosstalk between adjacent optical filters, wherein the optical grid structure comprises a capping layer configured to have a structure that includes (1) an enclosure filled with air to form an air layer disposed between the optical filters and (2) an open area in the enclosure to expose the enclosure to an outside of the optical grid structure, wherein a first width of a top surface of the air layer is smaller than a second width of a bottom surface of the air layer.

In accordance with implementations of the disclosed technology, it is possible to effectively prevent popping in the optical grid structure including the air layer.

In addition, it is possible to provide various effects which are directly or indirectly understood through this document.

DETAILED DESCRIPTION

Hereafter, various embodiments will be described with reference to the accompanying drawings. However, it should be noted that the present disclosure is not limited to specific embodiments, but includes various modifications, equivalents and/or alternatives of embodiments. The embodiments of the present disclosure may provide various effects which can be directly/indirectly recognized through the present disclosure.

Figure 1:
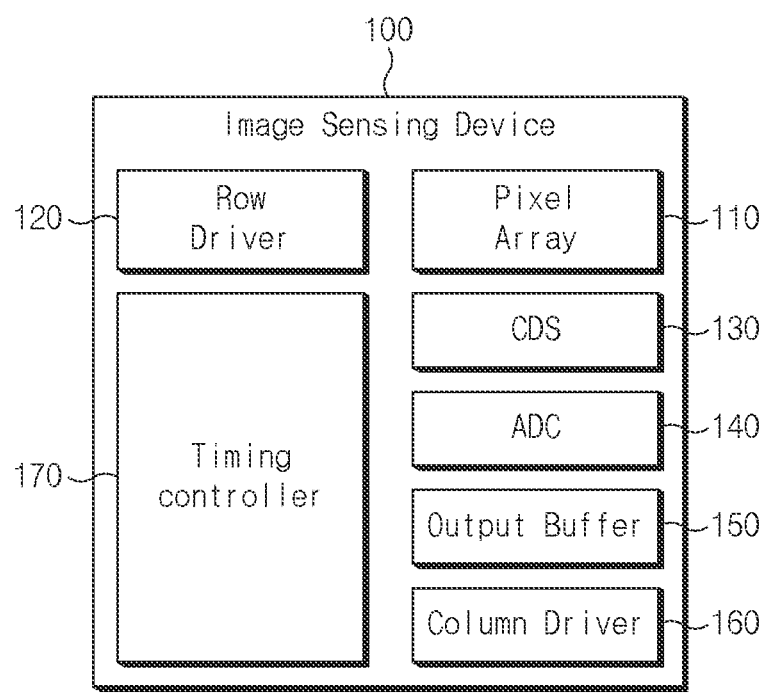
FIG. 1 shows an example of a block diagram illustrating an image sensing device in accordance with an embodiment.

FIG. 1 is a block diagram illustrating an image sensing device in accordance with an embodiment.

Referring to FIG. 1, an image sensing device 100 may include a pixel array 110, a row driver 120, a CDS (Correlated Double Sampler) 130, an ADC (Analog-Digital Converter) 140, an output buffer 150, a column driver 160 and a timing controller 170. The components of the image sensing device 100 are only examples, and at least some of the components may be added or omitted, if necessary.

The pixel array 110 may include a plurality of unit pixels arranged at the respective intersections between a plurality of rows and a plurality of columns. In an embodiment, the plurality of unit pixels may be arranged in a 2D pixel array including rows and columns. In another embodiment, the plurality of unit image pixels may be arranged in a 3D pixel array. The plurality of unit pixels may convert optical signals into electrical signals in units of unit pixels or pixel groups, and the unit pixels within each pixel group may share at least a specific internal circuit. The pixel array 110 may receive a driving signal, including a row selection signal, a pixel reset signal and a transmission signal, from the row driver 120. According to the driving signal, the corresponding unit pixel of the pixel array 110 may be enabled to perform an operation corresponding to the row selection signal, the pixel reset signal or the transmission signal.

Based on commands and control signals which are supplied by the timing controller 170, the row driver 120 may enable the pixel array 110 to perform specific operations on the unit pixels included in the corresponding row. In an embodiment, the row driver 120 may select one or more unit pixels arranged at one or more rows of the pixel array 110. The row driver 120 may generate a row selection signal to select at least one row among the plurality of rows. The row driver 120 may sequentially enable the pixel reset signal and the transmission signal for pixels corresponding to the selected at least one row. Thus, a reference signal and an image signal, which are analog signals generated from each of the pixels of the selected row, may be sequentially transferred to the CDS 130. The reference signal may be an electrical signal which is provided to the CDS 130 when a sensing node (e.g. floating diffusion node) of a unit pixel is reset, and the image signal may be an electrical signal which is provided to the CDS 130 when photocharges generated by the unit pixel are accumulated in the sensing node. The reference signal indicating unique reset noise of the pixel and the image signal indicating the intensity of incident light may be collectively referred to as a pixel signal.

The CMOS image sensor may sample a pixel signal twice in order to remove the difference between two samples, and thus use correlated double sampling to remove an undesired offset value of the pixel, such as fixed pattern noise. For example, through the correlated double sampling, the CMOS image sensor may remove the undesired offset value by comparing pixel output voltages acquired before and after photocharge generated by incident light is accumulated in the sensing node, thereby measuring a pixel output voltage based on only the incident light. In an embodiment, the CDS 130 may sequentially sample and hold the reference signals and the image signals, which are provided to a plurality of column lines, respectively, from the pixel array 110. That is, the CDS 130 may sample and hold the levels of the reference signal and the image signal which correspond to each of the columns of the pixel array 110.

The CDS 130 may transfer the reference signal and the image signal of each of the columns as a correlated double sampling signal to the ADC 140, based on a control signal from the timing controller 170.

The ADC 140 may convert the correlated double sampling signal for each of the columns, outputted from the CDS 130, into a digital signal and output the digital signal. In an embodiment, the ADC 140 may be implemented as a ramp-compare type ADC. The ramp-compare type ADC may include a comparison circuit configured to compare an analog pixel signal and a ramp signal which rises or falls with the elapse of time, and a counter configured to perform a counting operation until the ramp signal is matched with the analog pixel signal. In an embodiment, the ADC 140 may convert the correlated double sampling signal, generated by the CDS 130, for each of the columns into a digital signal, and output the digital signal.

The ADC 140 may include a plurality of column counters corresponding to the respective columns of the pixel array 110. The columns of the pixel array 110 may be coupled to the respective column counters, and image data may be generated by converting the correlated double sampling signals, corresponding to the respective columns, into digital signals through the column counters. In another embodiment, the ADC 140 may include one global counter, and convert the correlated double sampling signals corresponding to the respective columns into digital signals by using a global code provided from the global counter.

The output buffer 150 may temporarily hold the column-based image data provided from the ADC 140, and output the held image data. The output buffer 150 may temporarily store the image data outputted from the ADC 140 on the basis of a control signal of the timing controller 170. The output buffer 150 may operate as an interface which compensates for a difference in transfer rate or processing speed from another device coupled to the image sensing device 100.

The column driver 160 may select a column of the output buffer 150 on the basis of the control signal of the timing controller 170, and control the output buffer 150 to sequentially output the image data which are temporarily stored in the selected column of the output buffer 150. In an embodiment, the column driver 160 may receive an address signal from the timing controller 170, generate a column selection signal on the basis of the address signal, and select a column of the output buffer 150, such that the image data are outputted to the outside from the selected column of the output buffer 150.

The timing controller 170 may control one or more of the row driver 120, the CDS 130, the ADC 140, the output buffer 150 and the column driver 160.

The timing controller 170 may provide one or more of the row driver 120, the CDS 130, the ADC 140, the output buffer 150 and the column driver 160 with a clock signal required for the operations of the respective components of the image sensing device 100, a control signal for timing control, and address signals for selecting a row or column. According to an embodiment, the timing controller 170 may include at least one of a logic control circuit, a PLL (Phase-Locked Loop) circuit, a timing control circuit, a communication interface circuit, or others.

Figure 2:
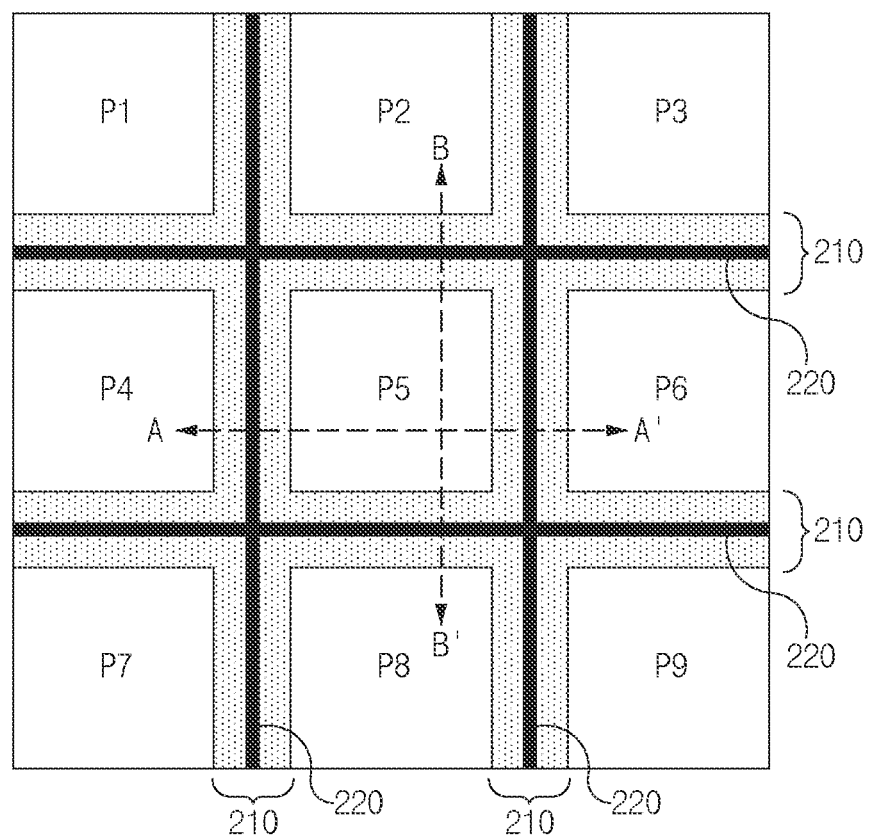
FIG. 2 shows an example of a diagram illustrating a part of a pixel array illustrated in FIG. 1.

FIG. 2 is a diagram illustrating a part of the pixel array illustrated in FIG. 1.

Referring to FIG. 2, a part 200 of the pixel array 110 may include nine unit pixels P1 to P9 arranged in a 3×3 matrix shape. Although FIG. 2 illustrates the nine unit pixels P1 to P9, the part 200 of the pixel array 110 may include a different number of unit pixels other than nine. Thus, the part 200 of the pixel array 110 can include K number of unit pixels that are configured and operated in substantially the same manner as the unit pixels P1 to P9 and arranged in a matrix shape composed of M rows and N columns, where M, N, K are random positive integers.

Each of the unit pixels P1 to P9 may include an optical grid structure 210 configured for optical isolation from the unit pixel adjacent thereto. The optical grid structure 210 may include air therein.

The optical grid structure 210 may be disposed between the pixels (for example, P1 and P2, P2 and P3) adjacent to each other in the row direction or the side-to-side direction of the pixel array 110 or between the pixels (for example, P1 and P4, P4 and P7) adjacent to each other in the column direction or the top-to-bottom direction of the pixel array 110. The optical grid structures 210 may be arranged in the row or column direction of the pixel array 110. The optical grid structure 210 may be elongated along one side of a unit pixel abutting thereon. The optical grid structure 210 may be included in each of pixels adjacent to the optical grid structure 210 in the top-to-bottom direction or side-to-side direction. The optical grid structures 210 may be configured to optically isolate pixels adjacent to the optical grid structure 210 in the top-to-bottom direction or side-to-side direction.

The optical grid structures 210 extended in the row and column directions of the pixel array 110, respectively, may be formed in a mesh type in which the optical grid structures 210 are connected as one body. Therefore, the optical grid structure adjacent to a specific unit pixel may be connected to the optical grid structure 210 adjacent to another random unit pixel.

Between the optical grid structures 210 disposed on the opposing sides of a unit pixel, an optical filter (for example, red, green, blue or yellow) of the corresponding unit pixel may be disposed. In some implementations, the optical grid structure 210 may be disposed to surround the optical filter of a certain unit pixel.

On a cross-section of a unit pixel, a micro-lens for gathering incident light into the corresponding pixel may be disposed over the optical filter, and a substrate including a photoelectric conversion element for converting the intensity of the incident light into an electrical signal may be disposed under the optical filter.

The incident light having passed through the micro-lens passes through the optical filter. At this time, the incident light having passed through the optical filter of a specific pixel may go over to another pixel through an adjacent optical filter, and cause optical crosstalk to generate noise in a pixel signal. The optical grid structure 210 may reflect such incident light into a specific pixel or absorb the incident light, thereby preventing optical crosstalk between adjacent pixels to improve the imaging operation.

The optical grid structure 210 may include an air layer in order to prevent optical crosstalk. The air layer is connected to an open area 220 that is exposed to outside of the optical filter.

The open area 220 is exposed to outside of the optical area and allows gas to move between the air layer and the outside of the optical grid structure 210. The open area 220 may be formed in the optical grid structure 210 and disposed according to the shape of the optical grid structure 210. In some implementations, the open area 220 may be disposed to surround a pixel.

Figure 3:
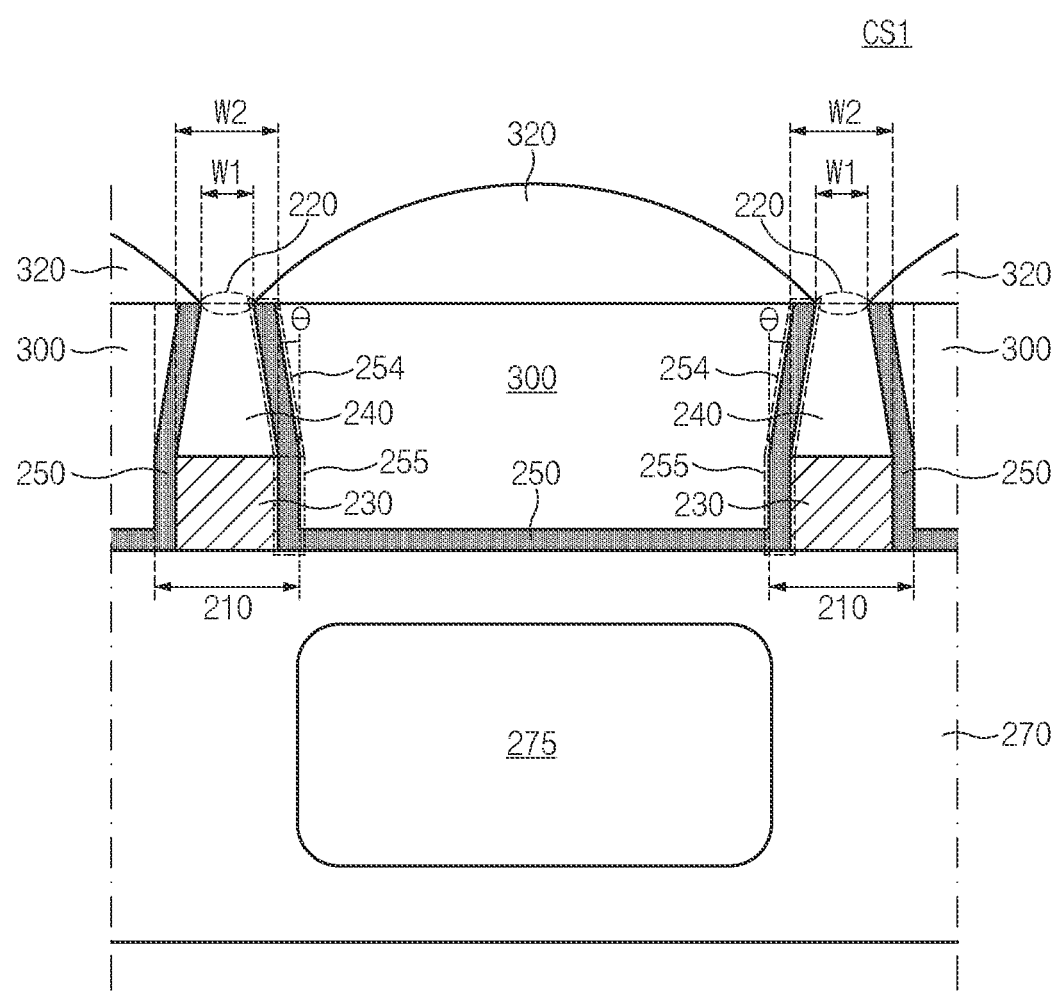
FIG. 3 shows an example of a cross-section diagram taken along a first or second line of FIG. 2.
Figure 4:
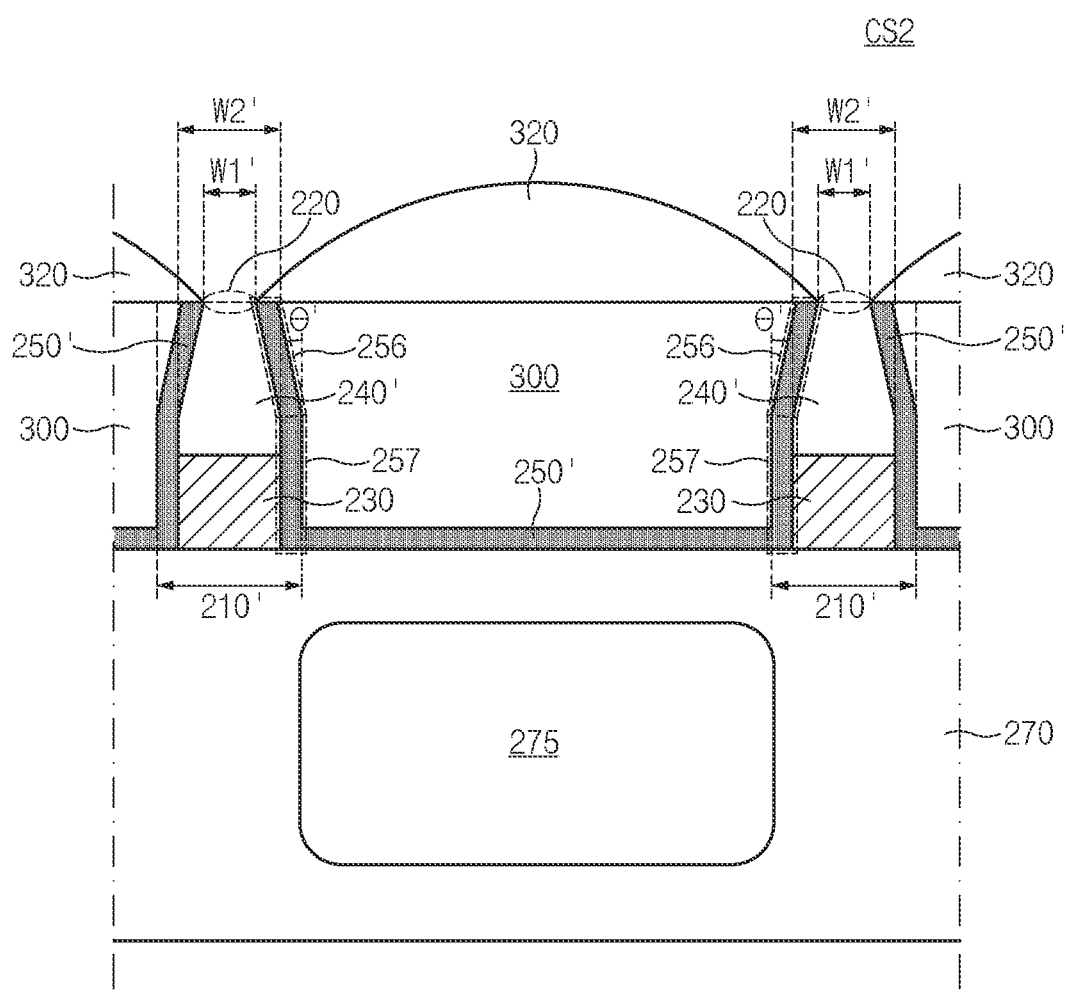
FIG. 4 shows an example of a cross-section diagram taken along a first or second line of FIG. 2.

In FIG. 2, a first cutting line A-A' and a second cutting line B-B' are shown. A cross-section taken along the first cutting line A-A' may be substantially the same as a cross-section taken along the second cutting line B-B'. Therefore, the implementations including the optical grid structure 210 as shown in FIGS. 3 and 4 correspond to cross-sectional views taken along the first or second cutting line A-A' or B-B'. FIGS. 5A to 5I show diagrams for illustrating a process for forming the optical grid structure 210.

FIG. 3 is a diagram illustrating an embodiment of the cross-section taken along the first or second cutting line of FIG. 2.

Referring to FIG. 3, the optical grid structures 210 are disposed on both sides of the fifth pixel P5 such that the optical structures 210 are spaced apart from each other by the width of the fifth pixel P5. As described above, an optical filter 300 of the fifth pixel P5 may be disposed between the optical grid structures 210 adjacent to each other in the side-to-side direction. FIG. 3 illustrates that the height of the top surface of the optical filter 300 is equal to the height of the optical grid structure 210. In some other implementations, the height of the top surface of the optical filter 300 may be larger or smaller than the height of the optical grid structure 210.

A cross-section CS1 taken along the first or second cutting line A-A' or B-B' may include a substrate 270, a photoelectric conversion element 275, the optical grid structure 210, the optical filter 300 and a micro-lens 320.

The substrate 270 may include top and bottom surfaces facing each other. In the descriptions below, the bottom and top surfaces of the substrate 270 may be referred to as a front side and a back side, respectively. The substrate 270 may be a P-type or N-type bulk substrate, a substrate obtained by growing a P-type or N-type epitaxial layer in a P-type bulk substrate, or a substrate obtained by growing a P-type or N-type epitaxial layer in an N-type bulk substrate.

The photoelectric conversion element 275 may generate and accumulate photocharge corresponding to the intensity of incident light. The photoelectric conversion element 275 may be disposed in an area corresponding to the fifth pixel P5 within the substrate 270. The photoelectric conversion element 275 may be formed as an N-type doping region through an ion implantation process of implanting N-type ions. According to an embodiment, the photoelectric conversion element 275 may include a plurality of doping regions stacked therein. In this case, a lower doping region may be formed by implanting N+ ions, and an upper doping region may be formed by implanting N− ions. The photoelectric conversion element 275 may be formed across as large an area as possible, in order to raise a fill factor indicating light receiving efficiency. According to an embodiment, an isolation film (not illustrated) may be formed between the photoelectric conversion elements of the pixels adjacent to each other. The isolation film may be vertically recessed to electrically and optically isolate the photoelectric conversion elements from each other.

The optical grid structure 210 may include a metal layer 230 and a capping layer 250 that are structured and positioned relative to each other to form an enclosure filled with air to form an air layer 240. This enclosure includes open area 220 to expose the space within the enclosure to the outside. The relative widths, heights and thicknesses of the respective components included in the optical grid structure 210 can be configured based on specifics of an imaging device in various sizes, dimensions or configurations and thus are not limited to those illustrated in FIG. 3.

The metal layer 230 may be disposed on the substrate 270. The metal layer 230 may be made of or include a metallic material (for example, tungsten) having a high light absorption rate. In an embodiment, the metal layer 230 may be formed by stacking different or the same metallic materials. In this case, the metal disposed at the bottom may be referred to as a barrier metal. In an embodiment, the metal layer 230 may be covered by an anti-reflection layer (not illustrated). The anti-reflection layer (not illustrated) may be disposed to cover the tops of the substrate 270 and the metal layers 230 included in the pixel array 110. The anti-reflection layer (not illustrated) may have a refractive index between the refractive indexes of the substrate 270 and the optical filter 300, in order to compensate for a difference in refractive index between the substrate 270 and the optical filter 300. For example, the anti-reflection layer (not illustrated) may be a dielectric film including one or more of silicon oxynitride ($Si_xO_yN_z$), silicon oxide ($Si_xO_y$), or silicon nitride ($Si_xN_y$) where x, y and z are natural numbers.

The metal layer 230 and capping layer 250 for forming the optical grid structure 210 can be structured so that the space for the air layer 240 may be disposed over the metal layer 230, and the shape of the air layer 240 may be defined by the capping layer 250. The space for the air layer 240 may be formed in a trapezoidal shape including an upper portion with a first width W1 and a lower portion with a second width W2. The first width W1 of the top surface of the air layer 240 may be smaller than the second width W2 of the bottom surface of the air layer 240. Therefore, the air layer 240 may have a width that gradually decreases toward the top surface.

The first width W1 may be equal to the width of the open area 220, and the second width W2 may be equal to the width of the metal layer 230. Unlike the structure of FIG. 3, the second width W2 may be smaller than the width of the metal layer 230. In this case, at least a part of the capping layer 250 may be in contact with the top surface of the metal layer 230, which makes it possible to further improve the shape stability of the air layer 240. The air layer 240 may have a relatively low refractive index of 1, for example.

The open area 220 for the space formed by the metal layer 230 and capping layer 250 for providing the air layer 240 may be provided in the optical grid structure 210 in a way that the air layer 240 may be connected to the outside of the optical grid structure 210, i.e. the area above the optical grid structure 210, through the open area 220. Therefore, the air or a gas can move between the outside of the optical grid structure 210 and the space for the air layer 240.

The capping layer 250 and the metal layer 230 may be structured and in contact with one another to form a partial enclosure with the open area 220 to surround the space for the air layer 240. In the example illustrated in FIG. 3, the capping layer 250 may be formed in contact with the side surfaces of the air layer 240 and the metal layer 230. For example, the capping layer 250 may be a dielectric film including one or more of silicon oxynitride ($Si_xO_yN_z$), silicon oxide ($Si_xO_y$) and silicon nitride ($Si_xN_y$) where x, y and z are natural numbers. According to an embodiment, the refractive index of the capping layer 250 may be higher than that of the air layer 240, and lower than that of the optical filter 300.

The capping layer 250 may be formed in such a shape that an area corresponding to the open area 220 is removed from a plane covering the top surface of the air layer 240. Therefore, the capping layer 250 may be disposed on the left and right sides of the open area 220. Furthermore, one surface of the capping layer 250 may abut on the air layer 240, and the other surface of the capping layer 250, facing the one surface, may abut on the optical filter 300.

The capping layer 250 may include a first layer 254 and a second layer 255. The first and second layers 254 and 255 may be disposed to abut on each other.

The first layer 254 may be tilted and extended toward the air layer 240 so as to have a predetermined inclination angle θ with respect to a vertical line to the rear surface of the substrate 270. The first layer 254 may be disposed to abut on the inclined surface of the air layer 240.

The second layer 255 may be extended along the vertical line to the rear surface of the substrate 270. The second layer 255 may be disposed to abut on a side surface of the metal layer 230.

The height of the boundary surface between the first and second layers 254 and 255 may be substantially equal to the height of the boundary surface between the air layer 240 and the metal layer 230. However, the scope of the present disclosure is not limited thereto. Each of the heights may indicate the height from the top surface of the substrate 270.

The thickness of the capping layer 250 may be experimentally set to a thickness required for stably maintaining the shape of the optical grid structure 210 including the air layer 240.

The capping layer 250 constituting the optical grid structure (210 on the left side of FIG. 3) disposed on one side of the optical filter 300 may be extended between the optical filter 300 and the substrate 270 along the rear surface of the substrate 270, and disposed under the optical filter 300. The capping layer 250 disposed under the optical filter 300 may be connected to the capping layer 250 which constitutes the optical grid structure 210 disposed on the other side of the optical filter 300. That is, the capping layer 250 constituting the optical grid structure 210 abutting on the optical filter 300 may be integrated with the capping layer 250 disposed under the optical filter 300.

Therefore, compared to the case in which the capping layer 250 is not disposed under the optical filter 300 but disposed only in the optical grid structure 210, the capping layer 250 for maintaining the shape of the optical grid structure 210 illustrated in FIG. 3 may be in contact with another component (e.g. the substrate 270) across a larger area, which makes it possible to improve the shape stability of the optical grid structure 210. Furthermore, the balance between tensions generated by the capping layers 250 disposed under the optical filters 300 on the left and right sides of the optical grid structure 210 can prevent the optical grid structure 210 with a relatively small width from tilting to one side (e.g. the left or right side).

Furthermore, the capping layer 250 disposed under the optical filter 300 may function as the anti-reflection layer which compensates for a difference in refractive index between the optical filter 300 and the substrate 270, such that light passing through the optical filter 300 can be effectively incident into the substrate 270. Therefore, although no separate anti-reflection layer is provided between the optical filter 300 and the substrate 270, the capping layer 250 may function as the anti-reflection layer, which makes it possible to reduce the entire thickness of the unit pixel.

In some implementations, the open area 220 may be formed as a separate area from the air layer 240 or the capping layer 250. In some implementations, the open area 220 may correspond to the top surface of the air layer 240 or the opening of the capping layer 250. In this case, the open area 220 may indicate at least a part of the capping layer 250, which is open to the outside of the optical grid structure 210 at the top of the air layer 240, such that gas can move between the outside of the optical grid structure 210 and the air layer 240.

The open area 220 may have a width equal to the first width W1 of the air layer 240. The width of the open area 220 may be experimentally set to secure the shape stability of the optical grid structure 210 while allowing gas to move.

The optical grid structure 210 may prevent light incident on an optical filter (e.g. the optical filter of the pixel P5) from moving to another optical filter (e.g. the optical filter of the pixel P4 or P6), thereby minimizing optical crosstalk.

Since the refractive index (e.g. 1) of the air layer 240 is lower than the refractive index (e.g. 1.6 to 1.7) of the optical filter 300 and the refractive index (e.g. 1.4) of the capping layer 250, the air layer 240 may induce reflection of the incident light, having passed through the micro-lens 320, the optical filter 300 and the capping layer 250, such that the incident light is reflected toward the photoelectric conversion element 275. Thus, the optical grid structure 210 can improve the optical detection efficiency of each pixel.

Even if the reflection by the air layer 240 does not occur due to incident angles and some incident light is refracted into the air layer 240, the incident light can be absorbed by the metal layer 230, which makes it possible to prevent optical crosstalk. This reduction of the optical crosstalk between adjacent pixels is another beneficial function of the optical grid structure 210.

As described above, the first width W1 of the air layer 240 is smaller than the second width W2 thereof, and the capping layer 250 is disposed to abut on the inclined surface of the air layer 240. Therefore, the width of the top surface of the optical grid structure 210 may be smaller than the width of the bottom surface thereof. Therefore, since the top surface of the optical grid structure 210 may be designed to have a minimum width, light reflected from the top surface of the optical grid structure 210 may be minimized to raise the light receiving efficiency of each pixel.

Suppose the case that the open area 220 is not present unlike the structure illustrated in FIG. 3. In this case, the air layer 240 is blocked from the outside without physically being connected to the outside, and the entire air layers 240 of the pixel array 110 are connected as one area.

In this case, since the capping layer 250 is formed in a thin film shape, the capping layer 250 may include weak points where popping may be caused by pressure under a temperature condition (e.g. high temperature condition) due to the fabrication environment or use environment, depending on the limitations of the fabrication process. At this time, the pressure applied to the weak points of the capping layer 250 increases with the increase in the temperature and volume of the internal air of the air layer 240. When the entire air layers of the pixel array 110 are connected as one area as supposed above, the pressure corresponding to the volume of the entire air layers 240 of the pixel array 110 may be concentrated on the weak points. In this case, popping may easily occur at the weak points.

However, since the air layer 240 is connected to the outside through the open area 220 in the optical grid structure 210 in accordance with the present embodiment, the internal air of the air layer 240 can connect with the external air even though the temperature and volume of the internal air are increased, which makes it possible to prevent popping at the weak points.

Furthermore, the capping layer 250 may collapse while the image sensing device is fabricated or used. In this case, since the capping layer 250 is tilted to the air layer 240 toward the open area 220, the capping layer 250 collapses toward the air layer 240, not the center of each pixel (e.g. the pixel P5). Therefore, the entire shape of the optical grid structure 210 may be maintained to secure the shape stability of the optical grid structure 210.

The optical filter 300 may be formed between the optical grid structures 210 adjacent to each other over the substrate 270, and selectively transmit a specific wavelength of light (for example, red, green, blue, magenta, yellow, cyan or the like). According to an embodiment, the optical filter 300 may be omitted or replaced with an IR (Infrared Ray) pass filter, when the unit pixel P5 corresponds to a depth pixel. The optical filter 300 may be disposed on the left and right sides of the open area 220.

The micro-lens 320 may be disposed over the optical filter 300, and raise light gathering power for incident light, thereby improving the light receiving efficiency of the photoelectric conversion element 275. The micro-lens 320 may not overlap the open area 220 in a vertical direction.

FIG. 4 is a diagram illustrating another embodiment of the cross-section taken along the first or second cutting line of FIG. 2.

Referring to FIG. 4, the cross-section taken along the first or second cutting line A-A' or B-B' shows that optical grid structures 210' are disposed on both sides thereof so as to be spaced apart from each other by the width of the fifth pixel P5.

A cross-section CS2 taken along the first or second cutting line A-A' or B-B' may include a substrate 270, a photoelectric conversion element 275, the optical grid structure 210', an optical filter 300 and a micro-lens 320. Since the cross-section CS2 is substantially the same as the cross-section CS1 described with reference to FIG. 3 except the shape of the optical grid structure 210', the overlapping descriptions will be omitted herein.

The optical grid structure 210' may include a metal layer 230, an air layer 240', a capping layer 250' and an open area 220'.

The air layer 240' may have a shape in which a rectangle and a trapezoid are stacked, unlike the air layer 240 illustrated in FIG. 3, which has a shape corresponding to a trapezoid. The trapezoid may include an upper portion having a first width W1' and a lower portion having a second width W2', and the rectangle may include upper and lower sides each having the second width W2'. Therefore, the open area 220' may have the first width W1'.

The capping layer 250' may include a first layer 256 and a second layer 257. The first and second layers 256 and 257 may be disposed to abut on each other.

The first layer 256 may be tilted and extended toward the air layer 240 so as to have a predetermined inclination angle θ with respect to a vertical line to the rear surface of the substrate 270. The first layer 256 may be disposed to abut on the inclined surface of the air layer 240.

The second layer 257 may be extended along the vertical line to the rear surface of the substrate 270. The second layer 257 may be disposed to abut on a rectangle-shaped side surface of the air layer 240 and a side surface of the metal layer 230.

The height of the boundary surface between the first and second layers 256 and 257 may be substantially equal to the height of the boundary surface between the trapezoidal shape and the rectangular shape of the air layer 240. Furthermore, the height of the boundary surface between the first and second layers 256 and 257 may be larger than the height of the boundary surface between the air layer 240 and the metal layer 230. Each of the heights may indicate the height from the top surface of the substrate 270.

According to the embodiment illustrated in FIG. 4, the height of the second layer 257 extended along the vertical line to the rear surface of the substrate 270 may be larger than the height of the metal layer 230. Thus, the height of the optical grid structure 210' may be adjusted regardless of the height of the metal layer 230.

Furthermore, the height of the second layer 257 is adjusted to control the length and inclination angle of the first layer 256, which makes it possible to select the optimal structure capable of raising the crosstalk prevention performance and light receiving efficiency of the optical grid structure 210'.

FIGS. 5A to 5I are diagrams for describing a process of forming the optical grid structure illustrated in FIG. 3.

Hereafter, a process of forming the optical grid structure 210 illustrated in FIG. 3 will be described with reference to FIGS. 5A to 5I. A cross-section illustrated in each of FIGS. 5A to 5I corresponds to the cross-section taken along the first or second cutting line A-A' or B-B' of FIG. 2. The descriptions of the process in accordance with the embodiment of the present disclosure will be focused on the process of forming the optical grid structure 210 illustrated in FIG. 3. However, a process of forming the optical grid structure 210' illustrated in FIG. 4 may be performed in substantially the same manner as the process of forming the optical grid structure 210 illustrated in FIG. 3, except some differences (e.g. the shape of an inclined photoresist pattern 290 of FIG. 5D and the height of a victim layer 282).

Figure 5A:
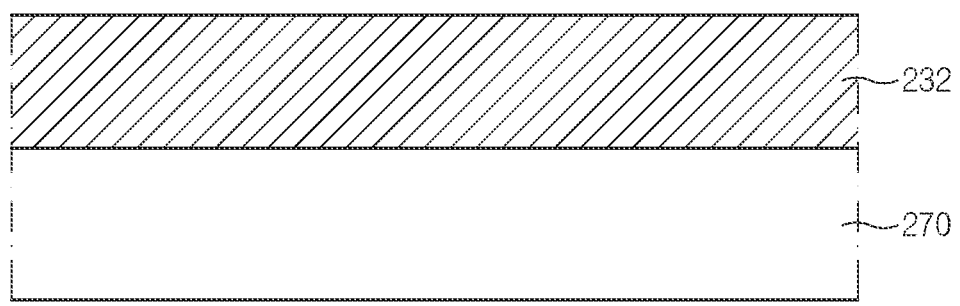
FIGS. 5A to 5I show diagrams for describing an example of a process of forming an optical grid structure illustrated in FIG. 3.

In step S10 of FIG. 5A, a metal 232 may be disposed on the substrate 270 through a deposition process. The height of the metal 232 may correspond to the height of the metal layer 230 of the optical grid structure 210.

Figure 5B:
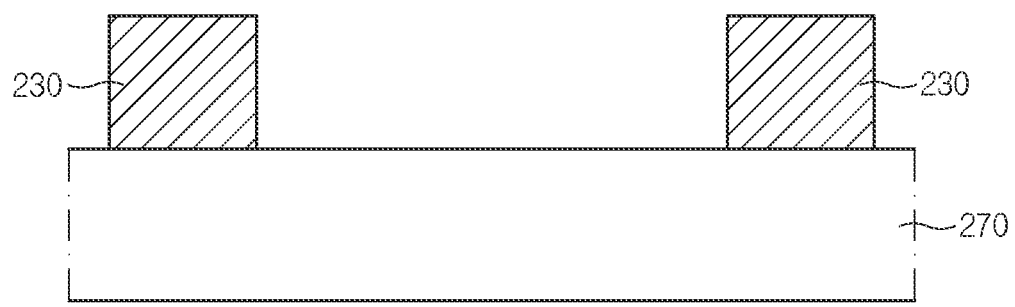

In step S20 of FIG. 5B, a mask corresponding to the metal layer 230 may be disposed on the metal 232, and the metal layer 230 may be formed through an etching process.

Figure 5C:
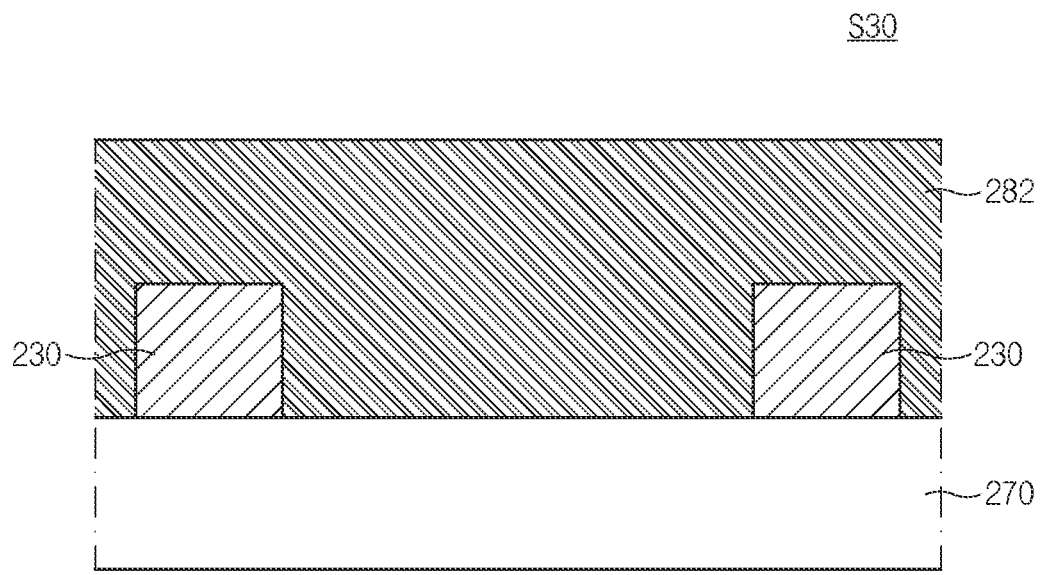

In step S30 of FIG. 5C, a victim layer 282 may be formed over the metal layer 230 and the substrate 270 through a deposition process. The victim layer 282 may include an SOC (Spin On Carbon) film which includes carbon.

Figure 5D:
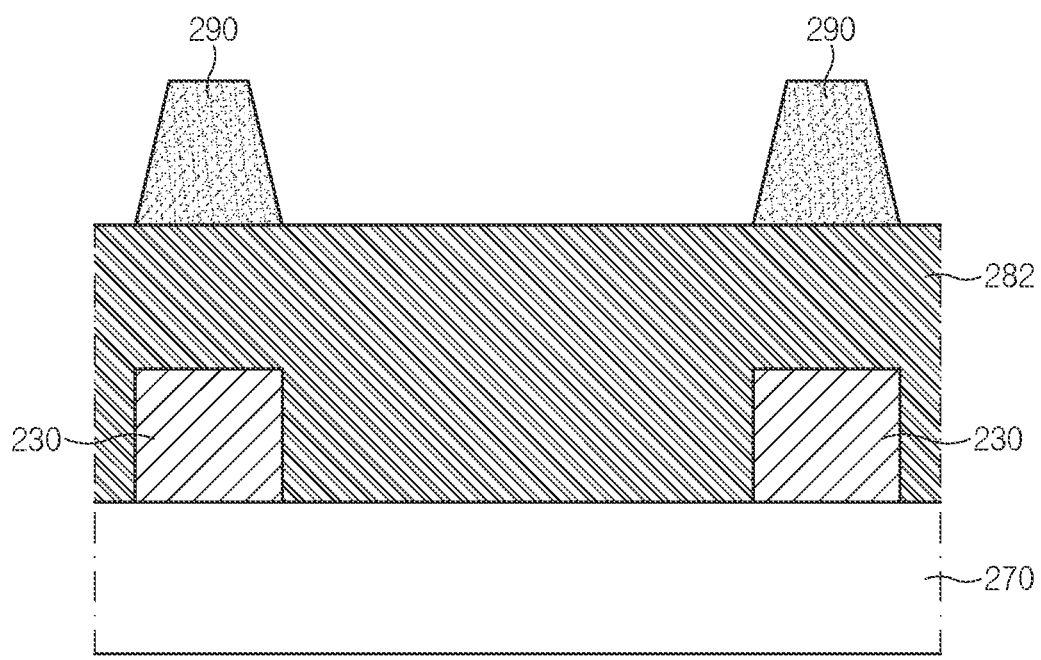

In step S40 of FIG. 5D, a photoresist pattern 290 defining the air layer 240 of the optical grid structure 210 may be disposed on the victim layer 282. The photoresist pattern 290 may have a predetermined slope with respect to a vertical line to the top surface of the substrate 270 so as to correspond to the air layer 240. The photoresist pattern 290 having such a shape may be formed by controlling the mask photoresist profile.

Figure 5E:
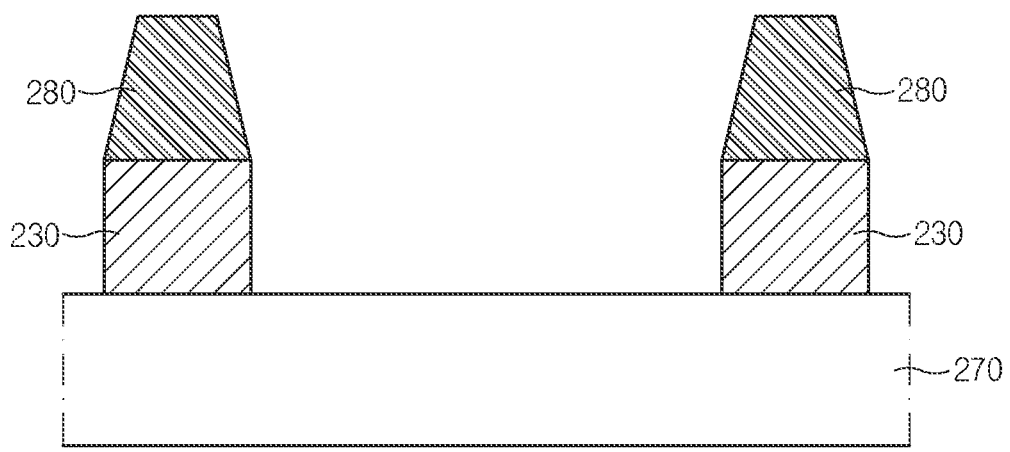

In step S50 of FIG. 5E, the victim layer 282 may be etched using the photoresist pattern 290 as an etching mask. Thus, the victim layer 282 disposed in an area (e.g. a unit pixel area), which does not correspond to the optical grid structure 210, may be removed. Furthermore, as the photoresist pattern 290 has a shape corresponding to the shape of the air layer 240, a victim pattern 280 may have substantially the same shape as that of the air layer 240, after the etching process is completed.

Figure 5F:
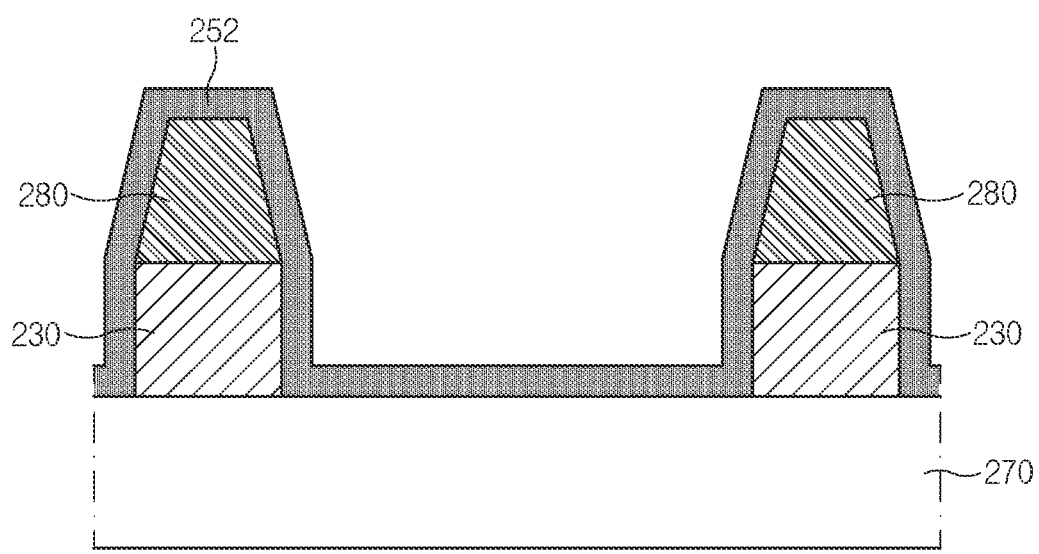

In step S60 of FIG. 5F, a capping layer 252 may be formed through a deposition process to cover the surfaces of the substrate 270, the metal layer 230 and the victim pattern 280.

Figure 5G:
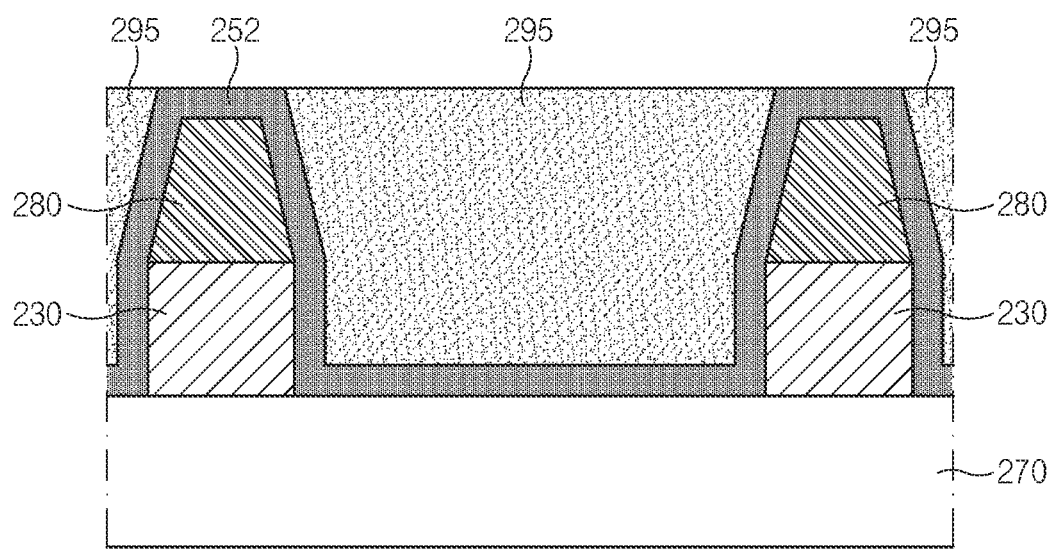

In step S70 of FIG. 5G, the empty space may be filled with a photoresist material 295 through a coating process, after the capping layer 252 is formed. Thus, the photoresist material 295 may be disposed between the stacked structure of the metal layer 230 and the victim pattern 280 and another adjacent stacked structure of the metal layer 230 and the victim pattern 280. The photoresist material 295 may fill the empty space so as to have substantially the same height as the top surface of the capping layer 252 disposed on the victim pattern 280.

Figure 5H:
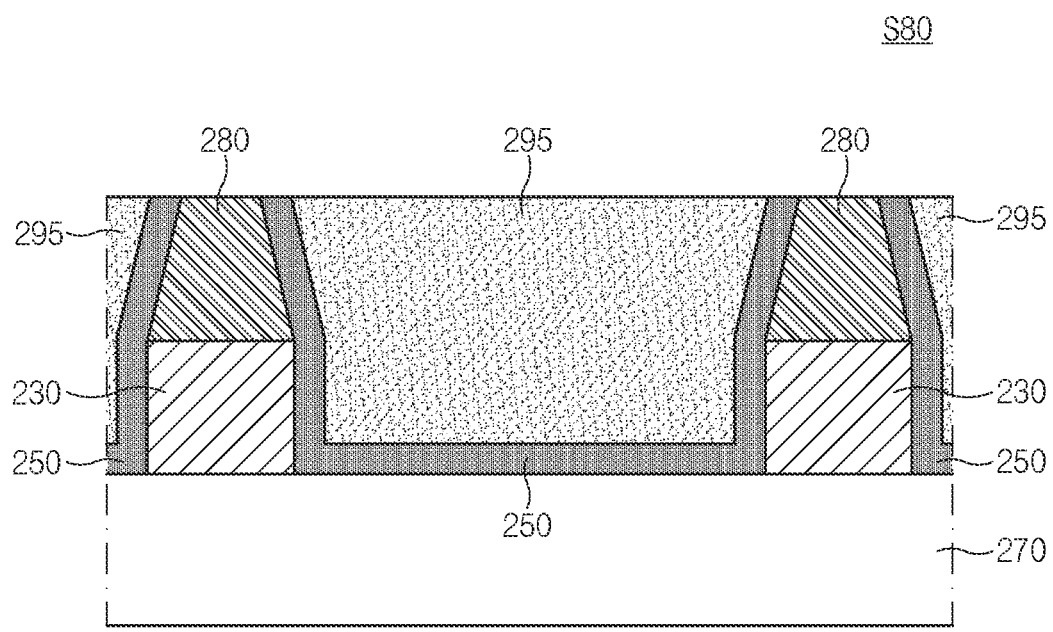

In step S80 of FIG. 5H, a blanket etch process may be performed on the capping layer 252 and the photoresist material 295, in order to form the open area 220. The blanket etch process may be performed until the top of the victim pattern 280 is exposed. Thus, the capping layer 252 disposed on the victim pattern 280 may be removed, and the capping layer 250 may be formed on either side of the open area 220.

Then, the remaining photoresist material 295 may be removed through a separate process (e.g. wet etching).

Figure 5I:
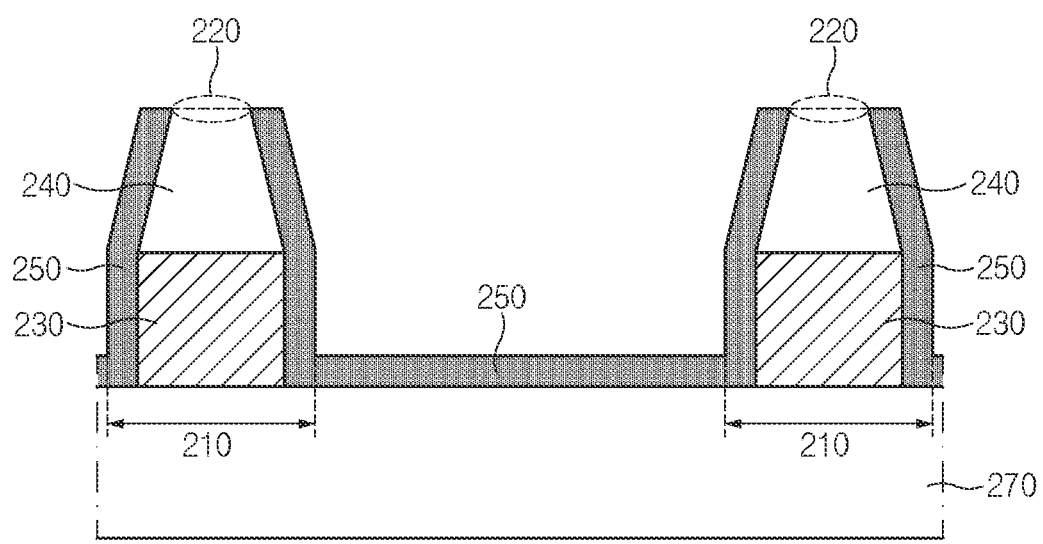

In step S90 of FIG. 5I, a plasma process may be performed to remove the victim pattern 280 and to form the air layer 240 at a position corresponding to the victim pattern 280. The plasma process may indicate a plasma process using gas containing one or more of oxygen, nitrogen and hydrogen, such as $O_2$, $N_2$, $H_2$, CO, $CO_2$ and $CH_4$. Here, an $O_2$ plasma process will be taken as an example for description. During the $O_2$ plasma process, oxygen radicals (O*) are introduced into the victim pattern 280 through the open area 220, and the introduced oxygen radicals are combined with carbon of the victim pattern 280 so as to generate CO or $CO_2$. The generated CO or $CO_2$ escapes to the outside through the open area 220. Through such a process, the victim pattern 280 may be removed, and the air layer 240 of the optical grid structure 210 may be formed at the position from which the victim pattern 280 has been removed.

In an embodiment, the optical filter 300 and the microlens 320, which are illustrated in FIG. 3, may be formed before the plasma process of removing the victim pattern 280 to maintain the shape stability of the optical grid structure 210. However, the scope of the present disclosure is not limited thereto.

While various embodiments have been described above, it will be understood to those skilled in the art that the embodiments described are examples only. Accordingly, variations and improvements of the described embodiments for image sensing devices described herein and other embodiments can be made based on what is disclosed in this patent document.

What is claimed is:

1. An image sensing device, comprising:
   a substrate including a plurality of photoelectric conversion elements each configured to generate photocharge in corresponding to incident light;
   a plurality of optical filters disposed over the substrate and configured to selectively transmit the incident light to the plurality of photoelectric conversion elements; and
   an optical grid structure disposed between the optical filters adjacent to each other and configured to reduce optical crosstalk between adjacent photoelectric conversion elements,
   wherein the optical grid structure comprises:
   a capping layer disposed along a boundary of the optical grid structure and structured to define a space with an open area to expose the space to an outside of the optical grid structure so that the space is filled with air as an air layer,
   wherein a first width of a top side of the air layer is smaller than a second width of a bottom side thereof.

2. The image sensing device of claim 1, wherein the capping layer comprises:
   a first layer disposed along a side of the air layer and inclined with a predetermined inclination angle with respect to a vertical line perpendicular to a top surface or a bottom surface of the air layer; and
   a second layer disposed to abut the first layer and extending along the vertical line.

3. The image sensing device of claim 2, wherein the optical grid structure further comprises a metal layer disposed under the air layer.

4. The image sensing device of claim 3, wherein the air layer has a shape corresponding to a trapezoid.

5. The image sensing device of claim 3, wherein the first layer is disposed to abut the air layer, and the second layer is disposed to abut the metal layer.

6. The image sensing device of claim 3, wherein the first layer and the second layer are disposed to abut at a height at which the air layer and the metal layer abut each other.

7. The image sensing device of claim 3, wherein the air layer has an upper part having a trapezoid shape and an lower part having a rectangular shape.

8. The image sensing device of claim 3, wherein the first layer is disposed to abut the air layer, and the second layer is disposed to abut the air layer and the metal layer.

9. The image sensing device of claim 3, wherein the first layer and the second layer are disposed to abut at a height which is higher than where the air layer and the metal layer abut each other.

10. The image sensing device of claim 3, wherein a width of the metal layer is larger than that the second width.

11. The image sensing device of claim 3, wherein the capping layer has an inner surface abutting the air layer and an outer surface abutting the optical filter.

12. The image sensing device of claim 1, wherein the capping layer has a refractive index larger than that of the air layer and smaller than that of the optical filter.

13. The image sensing device of claim 1, wherein the capping layer of the optical grid structure extends to a bottom of the optical filter.

14. The image sensing device of claim 1, further comprising a lens disposed over the optical filter, the lens not overlapping the open area.

15. An image sensing device, comprising:
optical filters that are disposed adjacent to each other; and
an optical grid structure disposed between the optical filters to reduce optical crosstalk between adjacent optical filters, wherein the optical grid structure comprises a capping layer configured to have a structure that includes (1) an enclosure filled with air to form an air layer disposed between the optical filters and (2) an open area in the enclosure to expose the enclosure to an outside of the optical grid structure, wherein a first width of a top surface of the air layer is smaller than a second width of a bottom surface of the air layer.

16. The image sensing device of claim 15, wherein the capping layer has a refractive index larger than a refractive index of the air layer and smaller than that of the optical filter.

17. The image sensing device of claim 15, wherein the capping layer extends to a bottom of the optical filter.

18. The image sensing device of claim 15, further comprising:
a metal layer disposed under the air layer and having side surfaces surrounded by the capping layer.

19. The image sensing device of claim 18, wherein the metal layer has a width that is greater than the first width.

20. The image sensing device of claim 18, wherein the side surfaces of the metal layer are inclined from a vertical line perpendicular to the bottom surface of the air layer.

* * * * *